United States Patent
Jeong

(10) Patent No.: US 8,049,241 B2
(45) Date of Patent: Nov. 1, 2011

(54) LIGHT EMITTING DEVICE FABRICATION METHOD THEREOF, AND LIGHT EMITTING APPARATUS

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/720,206

(22) Filed: Mar. 9, 2010

(65) Prior Publication Data

US 2010/0230703 A1    Sep. 16, 2010

(30) Foreign Application Priority Data

Mar. 10, 2009   (KR) .................. 10-2009-0020132

(51) Int. Cl.
*H01L 33/00* (2010.01)
(52) U.S. Cl. ............................. 257/98; 257/615; 438/46
(58) Field of Classification Search .................. 438/46; 257/615, 98
See application file for complete search history.

(56) References Cited

U.S. PATENT DOCUMENTS

| | | | |
|---|---|---|---|
| 6,797,987 B2 * | 9/2004 | Chen | 257/98 |
| 6,818,467 B2 * | 11/2004 | Lee et al. | 438/46 |
| 2003/0111667 A1 | 6/2003 | Schubert | |
| 2003/0141506 A1 | 7/2003 | Sano et al. | |
| 2005/0245018 A1 | 11/2005 | Bogner et al. | |
| 2006/0043399 A1 | 3/2006 | Miyagaki et al. | |
| 2007/0290215 A1 | 12/2007 | Kato et al. | |
| 2008/0006836 A1 | 1/2008 | Lee | |
| 2010/0038667 A1 | 2/2010 | Windisch | |

FOREIGN PATENT DOCUMENTS

| | | |
|---|---|---|
| DE | 10 2007 029 370 A1 | 11/2007 |
| JP | 2008-263015 A | 10/2008 |
| JP | 2008-283096 A | 11/2008 |
| JP | 2009-004471 A | 1/2009 |
| KR | 10-2007-0120424 A | 12/2007 |
| WO | WO 2006/043796 A1 | 4/2006 |
| WO | WO 2008/092417 A1 | 8/2008 |
| WO | WO 2008/135013 A2 | 11/2008 |

* cited by examiner

*Primary Examiner* — Kenneth Parker
*Assistant Examiner* — Dale E Page
(74) *Attorney, Agent, or Firm* — Birch, Stewart, Kolasch & Birch, LLP

(57) ABSTRACT

A light emitting device is provided. The light emitting device comprises a conductive substrate, a reflection layer, a support layer, an ohmic contact layer, and a light emitting semiconductor layer. The reflection layer is disposed on the conductive substrate. The support layer is disposed partially on the reflection layer. The ohmic contact layer is disposed at the side of the support layer. The light emitting semiconductor layer is disposed on the ohmic contact layer and the support layer.

7 Claims, 4 Drawing Sheets

LIGHT EMITTING DEVICE FABRICATION METHOD THEREOF, AND LIGHT EMITTING APPARATUS

CROSS-REFERENCE TO RELATED APPLICATIONS

The present application claims priority under 35 U.S.C. §119(a) of Korean Patent Application No. 10-2009-0020132 filed on Mar. 10, 2009, which is hereby incorporated by reference in its entirety.

BACKGROUND

The present disclosure relates to a light emitting device, a fabrication method thereof, and a light emitting apparatus.

A light emitting diode (LED) is a typical example of a light emitting device.

An LED has a light emitting semiconductor layer including a first conductivity type semiconductor layer, an active layer and a second conductivity type semiconductor layer, and emits light from the light emitting semiconductor layer according to power applied thereto.

For fabrication of an LED, a light emitting semiconductor layer is formed as an epitaxial layer on a growth substrate such as sapphire, and an ohmic contact layer and a reflection layer are formed on the light emitting semiconductor layer. A conductive substrate is formed on the reflection layer and then the growth substrate is removed to fabricate a vertical type LED.

Meanwhile, a breakage or lift-off phenomenon may occur during the fabrication process of the LED because the LED has a poor adhesion force between the light emitting semiconductor layer and the ohmic contact layer or between the ohmic contact layer and the reflection layer.

SUMMARY

Embodiments provide a light emitting device with a new structure, a fabrication method thereof, and a light emitting apparatus.

Embodiments also provide a light emitting device having a good adhesion force between a light emitting semiconductor layer and an ohmic contact layer, a fabrication method thereof, and a light emitting apparatus.

Embodiments also provide a light emitting device having a good adhesion force between an ohmic contact layer and an adhesion layer, a fabrication method thereof, and a light emitting apparatus.

Embodiments also provide a light emitting device having a good adhesion force between an ohmic contact layer and a reflection layer, a fabrication method thereof, and a light emitting apparatus.

In one embodiment, a light emitting device comprises: a conductive substrate; a reflection layer on the conductive substrate; a support layer disposed partially on the reflection layer; an ohmic contact layer disposed at the side of the support layer; and a light emitting semiconductor layer disposed on the ohmic contact layer and the support layer.

In another embodiment, a light emitting apparatus comprises: a body; a first electrode and a second electrode on the body; a light emitting device connected electrically to the first electrode and the second electrode on the body; and an encapsulation layer encapsulating the light emitting device, wherein the light emitting device comprises: a conductive substrate; a reflection layer on the conductive substrate; a support layer disposed partially on the reflection layer; an ohmic contact layer disposed at the side of the support layer; and a light emitting semiconductor layer disposed on the ohmic contact layer and the support layer.

In further another embodiment, a method of fabricating a light emitting device comprises: forming a light emitting semiconductor layer, comprising a first conductivity type semiconductor layer, an active layer and a second conductivity type semiconductor layer, on a growth substrate; forming a support layer partially on the light emitting semiconductor layer; forming an ohmic contact layer on the light emitting semiconductor layer between the support layer; forming a reflection layer on the ohmic contact layer and the support layer; forming a conductive substrate on the reflection layer; and removing the growth substrate and forming an electrode layer on the first conductivity type semiconductor layer.

The details of one or more embodiments are set forth in the accompanying drawings and the description below. Other features will be apparent from the description and drawings, and from the claims.

DETAILED DESCRIPTION OF THE EMBODIMENTS

Figure 1:
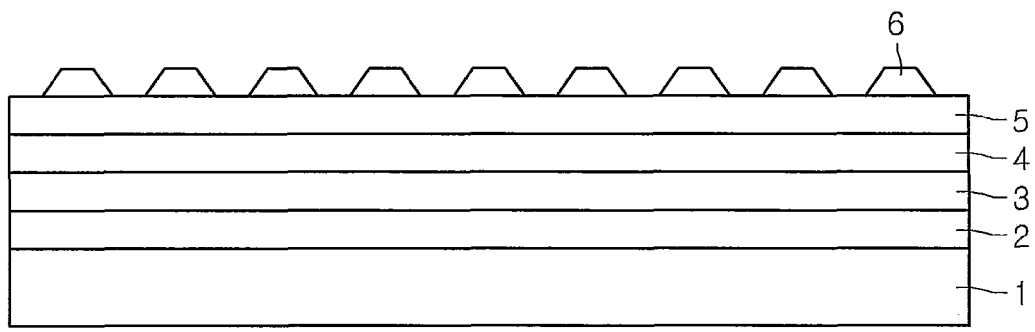
FIGS. 1 to 7 are views illustrating a light emitting device and a fabrication method thereof according to a first exemplary embodiment.

Reference will now be made in detail to the embodiments of the present disclosure, examples of which are illustrated in the accompanying drawings.

In the descriptions of embodiments, it will be understood that when a layer (or film), a region, a pattern, or a structure is referred to as being 'on/under' a substrate, a layer (or film), a region, a pad, or patterns, it can be directly on/under the substrate, the layer (or film), the region, the pad, or the patterns, or intervening layers may also be present. Also, Further, the reference about 'on' and 'under' each layer will be made on the basis of the drawings.

In the drawings, the dimension of each of elements may be exaggerated for clarity of illustration, and the dimension of each of the elements may be different from the actual dimension of each of the elements.

FIGS. 1 to 7 are views illustrating a light emitting device and a fabrication method thereof according to a first exemplary embodiment.

Referring to FIG. 1, an undoped GaN layer 2 including a buffer layer is formed on a growth substrate 1. A light emitting semiconductor layer including a first conductivity type semiconductor layer 3, an active layer 4 and a second conductivity type semiconductor layer 5 is formed on the undoped GaN layer 2.

For example, the growth substrate 1 may be sapphire ($Al_2O_3$), Si, SiC, GaAS, ZnO or MgO substrate.

The light emitting semiconductor layer may be a nitride-based semiconductor layer. The first conductivity type semiconductor layer 3 may be a GaN-based semiconductor layer including n-type impurities. For example, the first conductivity type semiconductor layer 3 may be a GaN-based semiconductor layer including Si. The second conductivity type semiconductor layer 5 may be a GaN-based semiconductor layer including p-type impurities. For example, the second conductivity type semiconductor layer 5 may be a GaN-based semiconductor layer including Mg. The active layer 4 may be formed to have a single quantum well (SQW) structure or a multiple quantum well (MQW) structure. For example, the active layer 4 may be formed to have a stack of an InGaN well layer/GaN barrier layer.

A mask layer 6 is formed on the second conductivity type semiconductor layer 5. The mask layer 6 may be formed to have an inclined surface in such a way that a bottom thereof adjacent to the second conductivity type semiconductor layer 5 is wider than a top thereof.

For example, the mask layer 6 may be formed by forming $SiO_2$ partially on the second conductivity type semiconductor layer 5 and then forming an inclined surface at a side thereof through an etching process.

Figure 2:
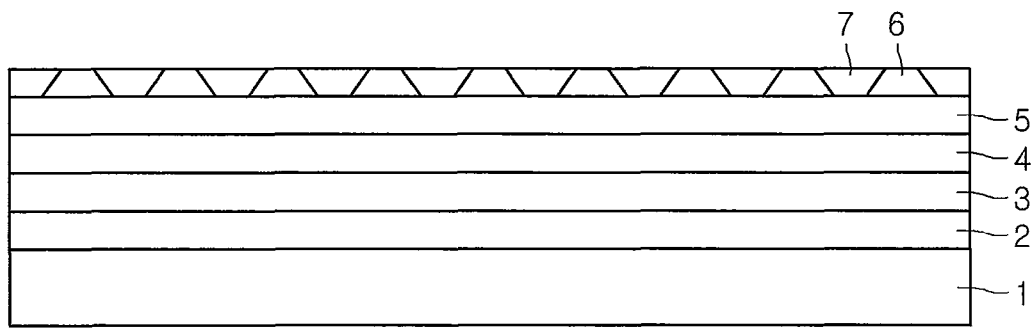
Figure 3:
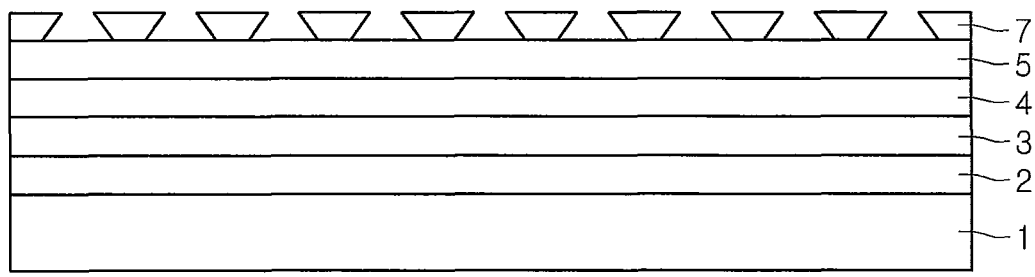

Referring to FIGS. 2 and 3, a support layer 7 is formed on the second conductivity type semiconductor layer 5 with the mask layer 6 formed thereon.

The support layer 7 may be a semiconductor layer including GaN or Zn. Second conductivity type impurities may or may not be implanted in the support layer 7.

The mask layer 6 is etched and removed after the forming of the support layer 7.

The support layer 7 is formed within 50% of the area of the second conductivity type semiconductor layer 5 so as not to interrupt the light emission of the light emitting device.

Figure 4:
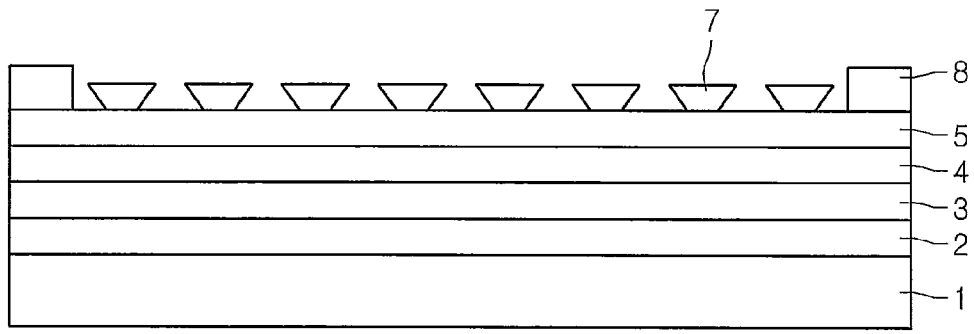
Figure 5:
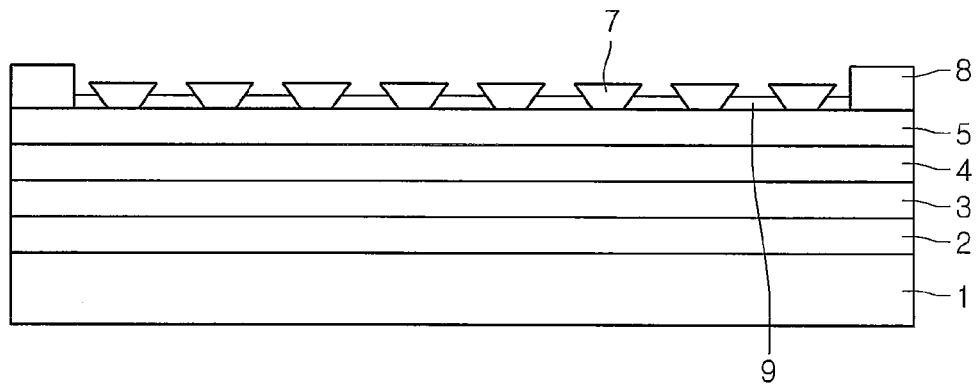

Referring to FIGS. 4 and 5, an etching protective layer 8 is formed on an edge region of the second conductivity type semiconductor layer 5 and an ohmic contact layer 9 is formed on a center region of the second conductivity type semiconductor layer 5.

The etching protective layer 8 prevents an electrical short from occurring when metal materials bound to the first conductivity type semiconductor layer 3 and the second conductivity type semiconductor layer 5 in an isolation etching process for dividing the light emitting device into chip units.

The etching protective layer 8 may be formed of a dielectric material or a conductive material. For example, the etching protective layer 8 may include at least one of $SiO_2$, $Si_3N_4$, ITO (Indium-Tin-Oxide), $TiO_2$, AZO (Aluminum-Zinc-Oxide) and IZO (Indium-Zinc-Oxide).

The ohmic contact layer 9 may be formed using a material that forms an ohmic contact with the second conductivity type semiconductor layer 5. For example, the ohmic contact layer 9 may be formed of at least one of ITO, AZO, IZO, Ni and Pt.

The etching protective layer 8 may be formed to be thicker than the support layer 7. The etching protective layer 8 may be formed after removal of the support layer 7 formed on the edge region of the second conductivity type semiconductor layer 5.

As another example, the etching protective layer 8 may be formed on the second conductivity type semiconductor layer 5 without removing the support layer 7 formed on the edge region of the second conductivity type semiconductor layer 5, in such a way that the support layer 7 is included inside the etching protective layer 8.

The etching protective layer 8 is not necessarily formed and may not be formed in the structure of the light emitting device according to other exemplary embodiments.

The ohmic contact layer 9 is formed thinner than the support layer 7 such that its side surfaces contact the support layer 7.

Figure 6:
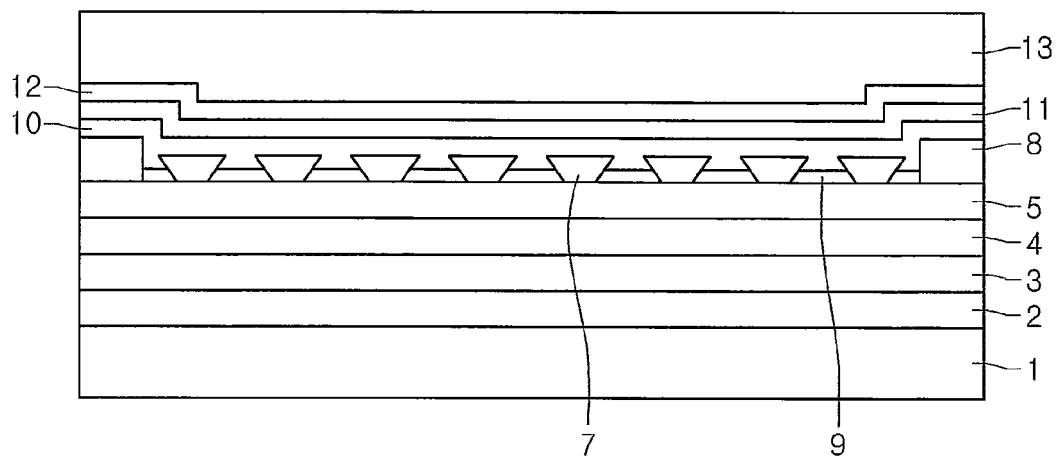

Referring to FIG. 6, an adhesion layer 10 is formed on the etching protective layer 8, the ohmic contact layer 9 and the support layer 7. The adhesion layer 10 may be formed to include at least one of Ni, Pt, Ti, AZO and IZO. If the adhesion layer 10 is formed using an oxide-based material such as AZO or IZO, the light transmittance can be improved.

Also, if the adhesion layer 10 is formed using an oxide-based material such as AZO or IZO, the adhesion layer 10 can be formed to be thick, thus making it possible to prevent a material of a reflection layer 11 from diffusing into the light emitting semiconductor layer.

If the adhesion layer 10 is formed of the same material as the ohmic contact layer 9, the adhesion layer 10 may not be separately formed or the adhesion layer 10 may be formed to be thick to surround the support layer 7.

A reflection layer 11 is formed on the adhesion layer 10. The reflection layer 11 may include at least one of Ag, Al, Ag—Pd—Cu and Ag—Cu that have high light reflectance.

A seed layer 12 is formed on the reflection layer 11. The seed layer 12 may include one of Ag, Al, Ag—Pd—Cu and Ag—Cu.

A conductive substrate 13 is formed on the seed layer 12. For example, the conductive substrate 13 may be formed on the seed layer 12 by plating copper (Cu).

As another example, a bonding layer (not illustrated), instead of the seed layer 12, may be formed on the reflection layer 11 and then the conductive substrate 13 may be bonded to the bonding layer. Herein, the conductive substrate 13 may include at least one of Ti, Cu, Cr, Ni, Al, Pt, Au, W, Mo and a doped semiconductor substrate.

Figure 7:
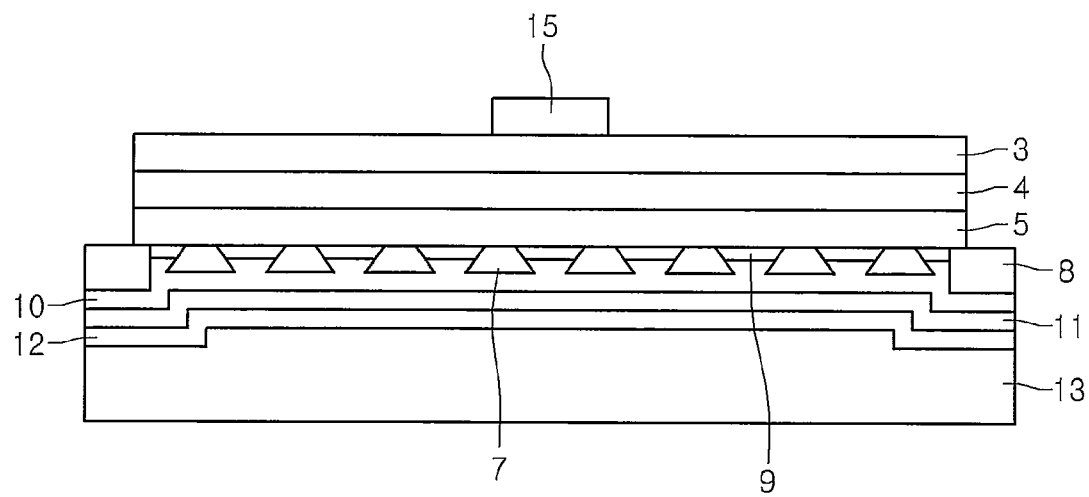

Referring to FIG. 7, the growth substrate 1 is removed from the structure of FIG. 6 through a LLO (Laser Lift Off) or CLO (Chemical Lift Off) process. At this point, the undoped GaN layer 2 may also be removed.

Thereafter, an isolation etching process is performed to divide the light emitting device into chip units. The isolation etching process may be performed through an ICP (Induced Coupled Plasma) etching process. The edge regions of the second conductivity type semiconductor layer 5, the active layer 4 and the first conductivity type semiconductor layer 3 are partially removed through the isolation etching process.

At this point, a portion of the etching protective layer 8 is exposed and the etching protective layer 8 can prevent an electrical short from occurring when foreign materials adhere to the light emitting semiconductor layer by the isolation etching process.

Thereafter, an electrode 15 is formed on the first conductivity type semiconductor layer 3.

Accordingly, a vertical type light emitting device is fabricated.

As illustrated in FIG. 7, in the light emitting device according to the first exemplary embodiment, a seed layer 12 or a bonding layer is formed on the conductive substrate 13 and a reflection layer 11 is formed on the seed layer 12 or the bonding layer. Thereafter, an adhesion layer 10 is formed on the reflection layer 11.

The etching protective layer 8 is formed on an edge region of the adhesion layer 10, and the support layer 7 is selectively formed on a center region of the adhesion layer 10.

A portion of the support layer 7 adjacent to the reflection layer 11 may be wider than a portion of the support layer 7 adjacent to the second conductivity type semiconductor layer 5. That is, the support layer 7 is formed in such a way that the bottom is wider than the top and the side surfaces are inclined. For example, the support layer 7 may have a thickness of about 0.01 μm to about 0.5 μm and a width of about 0.01 μm to about 100 μm, and may be regularly or irregularly plural.

The support layer 7, the ohmic contact layer 9 and the adhesion layer 10 may be formed to engage with one another. That is, a portion of the support layer 7 is surrounded by the adhesion layer 10, and the top of the adhesion layer 10 between the support layers 7 is wider than the bottom of the adhesion layer 10. Also, a portion of the support layer 7 is surrounded by the ohmic contact layer 9, and the top of the ohmic contact layer 9 between the support layers 7 is wider than the bottom of the ohmic contact layer 9.

The support layer 7 may be a semiconductor layer including GaN or Zn. The support layer 7 has a strong adhesion force with respect to the second conductivity type semiconductor layer 5 than the ohmic contact layer 9. Thus, the support layer can reinforce the adhesion force between the second conductivity type semiconductor layer 5 and the ohmic contact layer 9 and the adhesion force of the ohmic contact layer 9 and the adhesion layer 10.

The support layer 7 may or may not be doped with second conductivity type impurities, and has a poorer carrier injection capability than the ohmic contact layer 9. Thus, the flow of a current flowing from the conductive substrate 13 to the second conductivity type semiconductor layer 5 may change according to the location of the support layer 7. For example, the support layer 7 may be disposed to overlap with the electrode 15, thereby reducing the concentration of a current flow under the electrode 15.

The embodiment has illustrated that a portion of the support layer 7 adjacent to the reflection layer 11 is wider than a portion of the support layer 7 adjacent to the second conductivity type semiconductor layer 5. However, in another embodiment, the width of a portion of the support layer 7 adjacent to the reflection layer 11 may be equal to the width of a portion of the support layer 7 adjacent to the second conductivity type semiconductor layer 5. In further another embodiment, a portion of the support layer 7 adjacent to the reflection layer 11 is narrower than a portion of the support layer 7 adjacent to the second conductivity type semiconductor layer 5. The support layer 7 increases the contact area of the ohmic contact layer 9 and the adhesion layer 10, thereby reinforcing the adhesion force between the second conductivity type semiconductor layer 5 and the ohmic contact layer 9 and the adhesion force of the ohmic contact layer 9 and the adhesion layer 10.

A light emitting semiconductor layer including the first conductivity type semiconductor layer 3, the active layer 4 and the second conductivity type semiconductor layer 5 is disposed on the support layer 7, the ohmic contact layer 9 and the etching protective layer 8, and the electrode 15 is disposed on the first conductivity type semiconductor layer 3.

Figure 8:
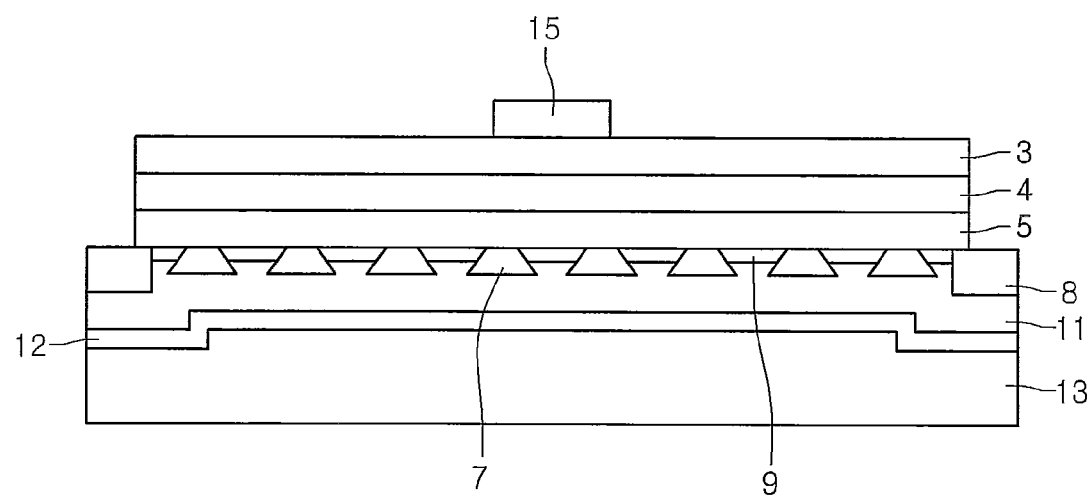
FIG. 8 is a view illustrating a light emitting device according to a second exemplary embodiment.

FIG. 8 is a view illustrating a light emitting device according to a second exemplary embodiment.

In describing a light emitting device according to a second exemplary embodiment, a description of an overlap with the light emitting device according to the first exemplary embodiment will be omitted for conciseness.

Referring to FIG. 8, in a light emitting device according to a second exemplary embodiment, the adhesion layer 10 is not formed and the reflection layer 11 may be formed under the ohmic contact layer 9.

In this case, the support layer 7, the ohmic contact layer 9 and the reflection layer 11 are formed to engage with one another. That is, a portion of the support layer 7 is surrounded by the reflection layer 11, and the top of the reflection layer 11 between the support layers 7 is wider than the bottom of the reflection layer 11. Also, a portion of the support layer 7 is surrounded by the ohmic contact layer 9, and the top of the ohmic contact layer 9 between the support layers 7 is wider than the bottom of the ohmic contact layer 9.

Because the reflection layer 11 is formed directly under the ohmic contact layer 9, the light emitting device according to the second exemplary embodiment has a higher light efficiency and a simpler fabrication process than the light emitting device according to the first exemplary embodiment.

Figure 9:
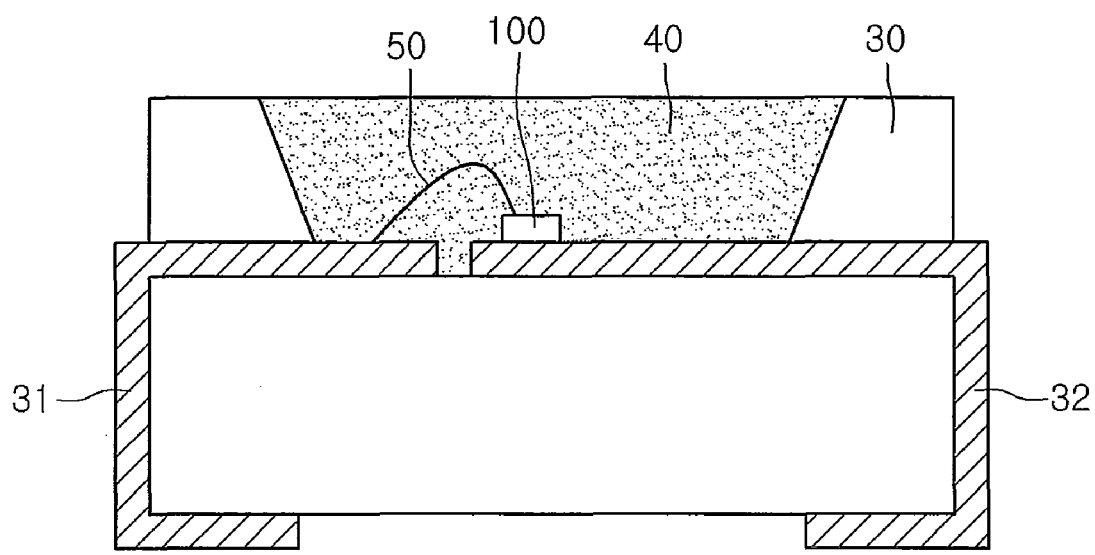
FIG. 9 is a view illustrating a light emitting apparatus including a light emitting device according to exemplary embodiments.

FIG. 9 is a view illustrating a light emitting apparatus including a light emitting device according to exemplary embodiments.

Referring to FIG. 9, a light emitting apparatus according to an exemplary embodiment includes a body 30, a first electrode 31 and a second electrode 32 disposed on the body 30, a light emitting device 100 disposed on the body 30 and connected electrically to the first electrode 31 and the second electrode 32, and an encapsulation layer 40 encapsulating the light emitting device 100.

The body 30 may be formed of a silicon material, a synthetic resin material or a metal material, and may have a cavity with inclined side surfaces.

The first electrode 31 and the second electrode 32 are electrically isolated from each other and provide power to the light emitting device 100. Also, the first electrode 31 and the second electrode 32 can increase the light efficiency by reflecting light generated by the light emitting device 100, and can discharge heat generated by the light emitting device 100.

The light emitting device 100 may be disposed on the body 30 or may be disposed on the first electrode 31 or the second electrode 32.

The light emitting device 100 may be electrically connected to the first electrode 31 and the second electrode 32 by one of wiring, flip-chip bonding and die bonding. In an exemplary embodiment, the light emitting device 100 is electrically connected to the first electrode 31 through a wire 50, and is electrically connected to the second electrode 32 by directly contacting the second electrode 32.

The encapsulation layer 40 may surround the light emitting device 100 to protect the light emitting device 100. Also, the encapsulation layer 40 may include a phosphor to change the wavelength of light emitted from the light emitting device 100.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a conductive substrate;
   a reflection layer on the conductive substrate;
   an adhesion layer on the reflection layer;

an adhesion reinforcement layer disposed partially on the adhesion layer;

an ohmic contact layer on the adhesion layer disposed between the adhesion reinforcement layers; and a light emitting semiconductor layer on the ohmic contact layer and the adhesion reinforcement layer, wherein a portion of the adhesion reinforcement layer adjacent to the reflection layer is wider than a portion of the adhesion reinforcement layer adjacent to the light emitting semiconductor layer.

2. The light emitting device of claim 1, wherein a portion of a bottom surface and a lateral surface of the adhesion reinforcement layer is surrounded by the adhesion layer.

3. The light emitting device of claim 1, wherein a top surface of the adhesion reinforcement layer is coplanar with a top surface of the ohmic contact layer.

4. The light emitting device of claim 1, further comprising an etching protective layer disposed on periphery of a top surface of the adhesion layer.

5. The light emitting device of claim 1, wherein the adhesion reinforcement layer includes a GaN material or a material including Zn.

6. The light emitting device of claim 1, further comprising a seed layer between the conductive substrate and the reflection layer.

7. The light emitting device of claim 1, wherein the adhesion reinforcement layer is thicker than the ohmic contact layer.

* * * * *